United States Patent
Takahata et al.

(10) Patent No.: US 8,334,158 B2
(45) Date of Patent: Dec. 18, 2012

(54) SENSOR DEVICE AND MANUFACTURING METHOD THEREOF

(75) Inventors: Toshihiko Takahata, Nukata-gun (JP); Takashige Saito, Ama-gun (JP); Masahiro Honda, Okazaki (JP); Shinpei Taga, Nishio (JP); Haruhisa Koike, Takahama (JP)

(73) Assignee: DENSO CORPORATION, Kariya (JP)

( * ) Notice: Subject to any disclaimer, the term of this patent is extended or adjusted under 35 U.S.C. 154(b) by 304 days.

(21) Appl. No.: 12/716,436

(22) Filed: Mar. 3, 2010

(65) Prior Publication Data

US 2010/0224945 A1    Sep. 9, 2010

(30) Foreign Application Priority Data

Mar. 4, 2009   (JP) .................................. 2009-50454

(51) Int. Cl.
*H01L 21/00* (2006.01)
(52) U.S. Cl. ... 438/51; 438/127; 257/415; 257/E21.003; 257/E21.502
(58) Field of Classification Search .................. 257/415, 257/E21.003, E21.502; 438/51, 127
See application file for complete search history.

(56) References Cited

U.S. PATENT DOCUMENTS

| 7,223,637 | B2 | 5/2007 | Saitou | |
|---|---|---|---|---|
| 2009/0127697 | A1 * | 5/2009 | Pahl | 257/698 |

FOREIGN PATENT DOCUMENTS

| JP | H08-159897 A | | 6/1996 |
|---|---|---|---|
| JP | 2005198085 A | * | 7/2005 |
| JP | A-2005-198085 | | 7/2005 |
| JP | 2008137139 A | * | 6/2008 |
| JP | A-2008-137139 | | 6/2008 |
| JP | 2008-292182 A | | 12/2008 |
| JP | 2009-021333 A | | 1/2009 |

OTHER PUBLICATIONS

Office Action mailed Nov. 1, 2011 in corresponding JP Application No. 2010-037383 (and English Translation).

* cited by examiner

*Primary Examiner* — Robert Huber
(74) *Attorney, Agent, or Firm* — Posz Law Group, PLC

(57) ABSTRACT

In manufacturing a sensor device, a sensor chip having a sensing portion on a surface thereof is mounted on one surface of a substrate, and a resin having a volatile property is arranged on the surface of the sensor chip, thereby covering the surface of the sensor chip. Then, the sensor chip and the substrate are sealed by a sealing member. After that, the sealing member is cured, and the resin is heated to be vaporized so that a void is formed between a covered portion in the surface of the sensor chip, which is covered by the sealing member, and the sealing member.

7 Claims, 15 Drawing Sheets

SENSOR DEVICE AND MANUFACTURING METHOD THEREOF

CROSS REFERENCE TO RELATED APPLICATION

The present application is based on Japanese Patent Application No. 2009-50454 filed on Mar. 4, 2009, the disclosure of which is incorporated herein by reference.

FIELD OF THE INVENTION

The present invention relates to a sensor device including a sensor chip having a sensing portion for detecting mechanical quantity and a manufacturing method of the sensor device.

BACKGROUND OF THE INVENTION

For example, in a conventional sensor chip of such a sensor device, a sensing portion for detecting mechanical quantity is displaced when mechanical quantity such as a pressure, a speed of acceleration or the like is applied to the sensing portion, and the sensing portion detects the mechanical quantity based on the displacement. In particular, an example of the sensing portion includes a diaphragm in a pressure sensor, a beam structural body as a movable portion in an acceleration sensor or the like.

In such a sensor device, stress may be applied to the sensor chip due to the differences of coefficients of thermal expansion of the sensor chip, a substrate, a sealing member that seals the sensor chip and the substrate, or the like. The sensing portion of the sensor chip is susceptible to the stress, thereby a detection error may be caused in the sensor device. Therefore, the stress applied to the sensor chip needs to be reduced as much as possible.

JP-A-8-159897 describes a method for mounting a sensor chip with little stress. According to JP-A-8-159897, in order to reduce stress due to a die-bonding material, a substrate is separated from a sensor chip by disposing a glass pedestal between the substrate and the sensor chip thereby stress due to differences of coefficients of thermal expansion thereof can be reduced. Further, by using silicone resin having low elasticity as a resin for bonding the sensor chip, stress due to a die-bonding material can be reduced.

SUMMARY OF THE INVENTION

The inventors of the present invention mounted a sensor chip having a sensing portion for detecting mechanical quantity on a substrate and considered a configuration of covering the sensor chip and the substrate by a sealing member made of resin. For example, electrical connection portions in the sensor chip and electrical processing circuits on the substrate are protected by the sealing member.

A sensor device having such a configuration is manufactured by the following method. A sensor chip having a sensing portion is mounted on one surface of a substrate, the sensor chip is electrically and mechanically connected to the substrate, and then the sensor chip and the substrate are covered and sealed by a sealing member.

In view of the method described in JP-A-8-159897 in the consideration by the inventors, a package may be enlarged and manufacturing processes may be increased because of using the glass pedestal, thereby cost may be increased. Thus, the sensor chip needs to be mounted on the substrate without using the glass pedestal.

Further, if the above-described silicone resin having low elasticity is used as the sealing member so as to reduce stress generated to the sensor chip, the stress can be reduced. However, when elasticity of the sealing member becomes low, a creep may be generated in the sealing member. Further, because the silicone resin has relatively-low heat resistance and swellability, the silicone resin has low reliability as the sealing member.

Generally, in view of heat resistance, epoxy-based resin is used as a sealing member for protecting electrical processing circuits on a substrate. Thus, the common epoxy-based resin is considered to be used as the sealing member. However, because elasticity of epoxy-based resin is higher than that of silicone resin, if the sealing member made of epoxy-based resin is in contact with the sensor chip, sensitivity of the sensor chip may be reduced due to the stress.

In view of the above points, it is an object of the present invention to provide a sensor device in which a sensor chip having a sensing portion for detecting mechanical quantity mounted on a substrate is sealed by a sealing member. Thus, stress generated to the sensor chip can be reduced as much as possible due to the sealing member. Further, it is another object of the present invention to provide a manufacturing method of the sensor device.

According to a first aspect of the present invention, a method for manufacturing a sensor device including a sensor chip having a sensing portion on a surface thereof, the sensing portion being configured to be displaced when mechanical quantity is applied to the sensing portion to detect the mechanical quantity based on the displacement, includes mounting the sensor chip on a first surface of a substrate; arranging a resin having at least one of a volatile property and a foamable property on the surface of the sensor chip, thereby covering the surface of the sensor chip; sealing the sensor chip covered by the resin and the substrate by a sealing member after the covering of the surface of the sensor chip; and curing the sealing member, and heating the resin to be vaporized or foamed after the sealing of the sensor chip and the substrate so that a void is formed between a covered portion in the surface of the sensor chip, which is covered by the sealing member, and the sealing member.

According to the configuration, the resin is vaporized or foamed to form the void between the surface of the sensor chip and the sealing member covering the surface of the sensor chip. Thus, the sealing member is spaced from the sensor chip, and adhesive force between the sealing member and the sensor chip is drastically reduced. Therefore, stress generated to the sensor chip from the sealing member can be reduced as much as possible.

According to a second aspect of the present invention, a sensor device includes a substrate; a sensor chip having a sensing portion on a surface thereof, the sensing portion being configured to be displaced when mechanical quantity is applied to the sensing portion to detect the mechanical quantity based on the displacement, and the sensor chip being mounted on one surface of the substrate; and a sealing member covering the sensor chip and the substrate. The sealing member is arranged to be spaced by a void from a covered portion in the surface of the sensor chip, which is covered by the sealing member.

According to the configuration, the void is formed between the surface of the sensor chip and the sealing member covering the surface of the sensor chip. Thus, adhesive force between the sealing member and the sensor chip is drastically reduced, and stress generated to the sensor chip from the sealing member can be reduced as much as possible.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Hereinafter, embodiments of the present invention will be described with reference to the drawings.

First Embodiment

Figure 1A:
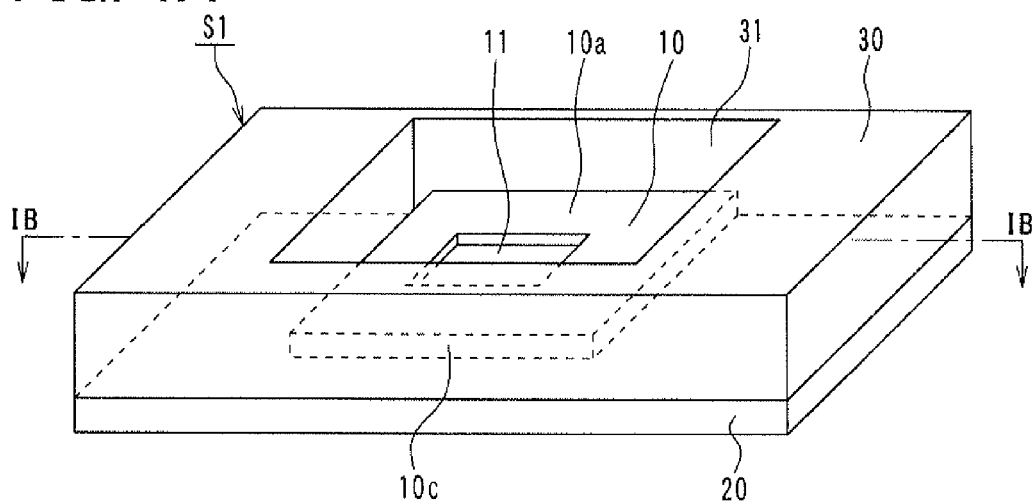
FIG. 1A is a perspective view showing a sensor device according to a first embodiment of the present invention.
Figure 1B:
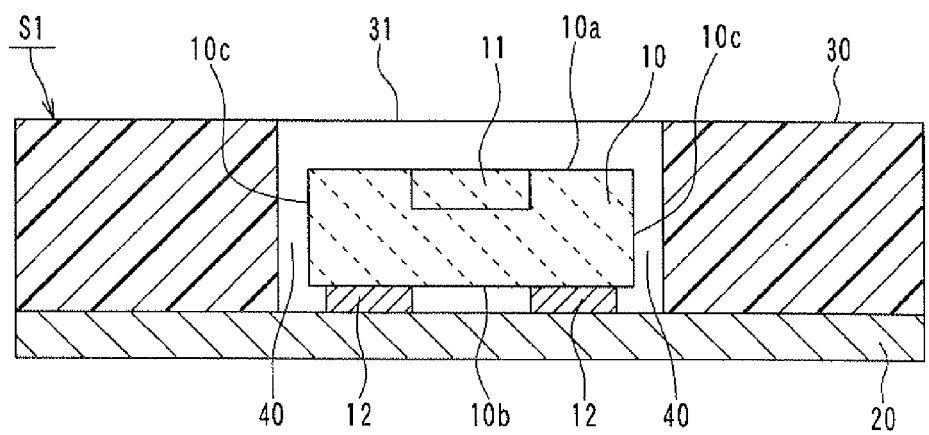
FIG. 1B is a cross-sectional view taken along a line IB-IB in FIG. 1A.

In a sensor device S1 of the present embodiment, a sensor chip 10 having a sensing portion 11 on a surface thereof is mounted on a surface of a substrate 20 (on an upper surface of the substrate 20, as shown in FIG. 1B), and the sensor chip 10 and the substrate 20 are covered and sealed by a sealing member 30.

The sensor chip 10 is made of a silicon semiconductor or the like, and is a MEMS (micro-electromechanical system) sensor formed by a common semiconductor process, etching process or the like. The sensing portion 11 is displaced when mechanical quantity is applied thereto, and the sensing portion 11 detects the mechanical quantity based on the displacement. The sensing portion 11 is located on the surface of the sensor chip 10 and configures a part of the surface of the sensor chip 10.

For example, the sensing portion 11 has a movable portion that is displaced when mechanical quantity such as a pressure, a speed of acceleration, an angular velocity or the like is applied to the sensing portion 11. The movable portion is formed by micro-fabrication with MEMS. Even when micro stress is applied to the sensor chip 10, the sensing portion 11 having such a movable portion is susceptible to the stress.

A specific example of the sensor chip 10 includes a pressure sensor chip having a thin diaphragm, which is strain-displaced by a pressure, as the sensing portion 11, an acceleration sensor chip and an angular velocity sensor chip each having a beam structural body constructed of a comb-like movable electrode and a fixed electrode, which are displaced by a speed of acceleration or an angular velocity, as the sensing portion 11.

In the present embodiment, the sensor chip 10 includes an electrode 12 on a lower surface 10b that is opposed to the substrate 20, and the sensing portion 11 on an upper surface 10a that is an opposite surface to the lower surface 10b. For example, the electrode 12 is a projection such as a bump made of gold or copper formed by stud bump bonding or plating, and a solder bump. The electrode 12 protrudes from the lower surface 10b of the sensor chip 10.

The electrode 12 is configured such that the sensor chip 10 is electrically connected to the outside and sending-receiving of an electrical signal between the sensing portion 11 and the outside via the electrode 12 can be performed. Although not shown in the drawing, the sensing portion 11 is electrically connected to the electrode 12 via a through electrode or the like arranged inside the sensor chip 10, for example.

A common wiring substrate such as a printed substrate and a ceramic substrate is used as the substrate 20. A lead frame may be used as the substrate 20. Further, the substrate 20 may be a single-layer substrate or a multilayer substrate. That is, any substrate can be used as the substrate 20 as long as the sensor chip 10 is mounted on the substrate and the substrate is electrically connected to the sensor chip 10.

As shown in FIG. 1B, the sensor chip 10 is arranged such that the lower surface 10b is opposed to the substrate 20, and the electrode 12 is electrically and mechanically connected to the substrate 20 by pressure bonding such as the application of pressure and heat. In particular, although not shown in the drawing, a land made of a conductor is arranged on a connection portion of the substrate 20 to the electrode 12, and the land is connected to the electrode 12.

The sensor chip 10 is electrically and mechanically connected to the substrate 20 via the electrode 12. Thus, the sensor chip 10 is supported on the substrate 20, and sending-receiving of an electrical signal between the sensor chip 10 and the substrate 20 and drive control of the sensor chip 10 by the substrate 20 can be performed.

In this manner, the sensor chip 10 is mounted on the upper surface of the substrate 20 by flip-chip bonding with the sensing portion 11 being toward an opposite side to the upper surface. In order to strengthen the mechanical connection between the sensor chip 10 and the substrate 20, underfill resin may be interposed between the lower surface 10b and the substrate 20.

The sealing member 30 is arranged on the upper surface of the substrate 20, that is, the surface on which the sensor chip 10 is mounted, to cover and seal the sensor chip 10 and the substrate 20. An opposite surface to the upper surface of the substrate 20, i.e., a lower surface of the substrate 20, is not covered by the sealing member 30 and is exposed to the outside. The sealing member 30 is made of a molding material such as epoxy-based resin having high heat resistance, which is used for a common molding package.

The sealing member 30 covers the upper surface of the substrate 20 and a side surface 10c of the sensor chip 10. Thus, the sealing member 30 protects a circuit or the like, which is not shown in the drawing, on the upper surface of the substrate 20, and the connection portion of the substrate 20 to the electrode 12.

The upper surface 10a and the sensing portion 11 arranged thereon are not covered and sealed by the sealing member 30. In the present embodiment, the sensing portion 11 as a part of the surface of the sensor chip 10 is not sealed by the sealing member 30, that is, the sensing portion 11 is an unsealed portion. Thus, the unsealed sensing portion 11 is an exposed portion of the surface of the sensor chip 10, which is exposed to the outside.

In the present embodiment, an opening 31 is provided in the sealing member 30 at a portion corresponding to the sensing portion 11 in the surface of the sensor chip 10. The sensing portion 11 is exposed to the outside through the opening 31. The configuration is favorable in the case where the sensing portion 11 detects a pressure, for example.

Further, a portion in the surface of the sensor chip 10, which is covered by the sealing member 30, is the side surface 10c of the sensor chip 10. A void 40 is provided between the side surface 10c and the sealing member 30.

That is, the side surface 10c is opposed to the sealing member 30 with the void 40 interposed therebetween. The sealing member 30 is separated from the side surface 10c and covers the side surface 10c. The void 40 opens into the sensing portion 11 as the unsealed portion, and further, opens into the outside via the sensing portion 11.

Figure 2A:
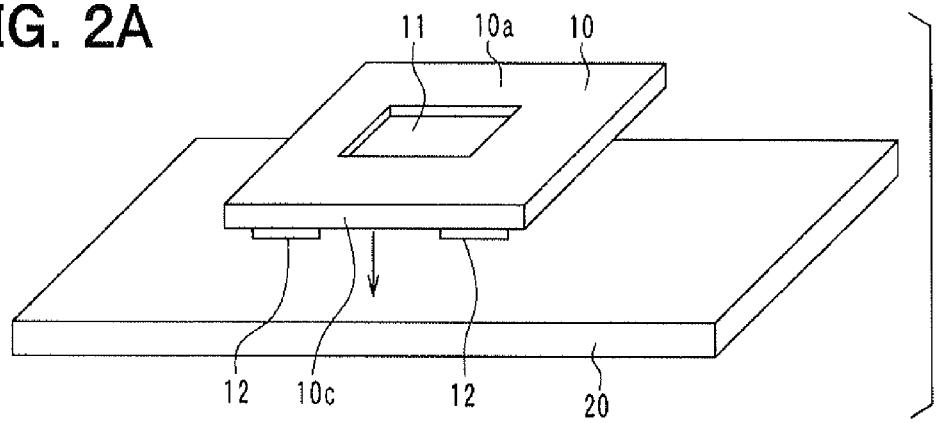
FIGS. 2A to 2D are views showing processes for manufacturing the sensor device in FIG. 1A.
Figure 2B:
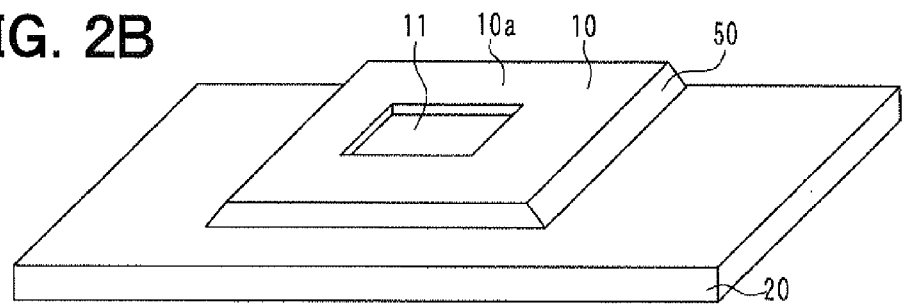
Figure 2C:
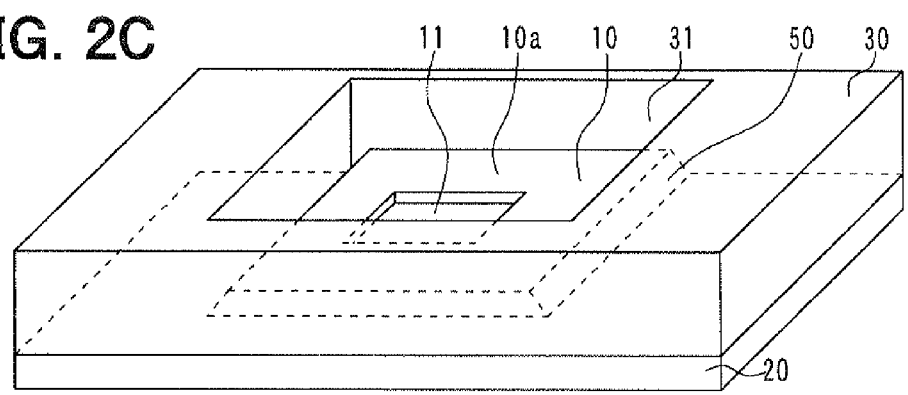
Figure 2D:
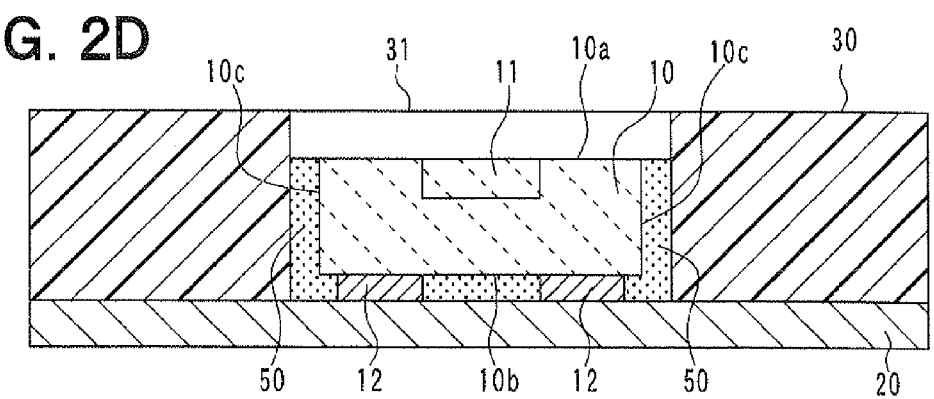

Next, a manufacturing method of the sensor device S1 will be described with reference to FIGS. 2A to 2D. FIGS. 2A to 2C are perspective views showing the respective processes, and FIG. 2D is a cross-sectional view showing the process of FIG. 2C.

As shown in FIG. 2A, the electrode 12 is formed on the lower surface 10b of the sensor chip 10 having the sensing portion 11, which is formed by a semiconductor process. The lower surface 10b is faced toward the substrate 20, the sensor chip 10 is mounted on the upper surface of the substrate 20, and the electrode 12 is connected to the substrate 20 by the application of pressure and heat or the like (chip mounting process).

After the sensor chip 10 is mounted on the upper surface of the substrate 20, volatile resin 50 is arranged on the surface of the sensor chip 10 and the surface of the sensor chip 10 is covered by the resin 50 (resin applying process). As shown in FIG. 2B, the resin 50 is applied to the side surface 10c of the sensor chip 10 by a dispenser or the like. The resin 50 may enter into a space between the lower surface 10b and the substrate 20.

The volatile resin 50 covers the surface of the sensor chip 10 at a temperature lower than a freezing point thereof, and is heated to be vaporized in the vaporizing process that is performed later. For example, PEG (polyethylene glycol) may be used as the resin 50.

The freezing point or the like of PEG varies in accordance with molecular weight. Thus, by using PEG having a desired freezing point, the resin 50 can be easily applied as described above. In the resin applying process with the use of PEG, it is preferable that a syringe is heated at a temperature equal to or higher than the freezing point and PEG is supplied by a jet dispenser.

Next, the sensor chip 10 covered by the resin 50 and the upper surface of the substrate 20 are sealed by the sealing member 30 (sealing process). The sealing member 30 as resin before being cured is applied by using a molding die or a dispenser, for example.

In the sealing process by the sealing member 30, the side surface 10c in the surface of the sensor chip 10 is covered by the sealing member 30. However, the upper surface 10a including the sensing portion 11 is not covered by the sealing member 30, that is, is the unsealed portion. Thus, the resin 50 arranged on the side surface 10c is configured to communicate with the outside via the sensing portion 11 (refer to FIGS. 2C and 2D).

After the sealing process, the sealing member 30 is cured, and the resin 50 is heated to be vaporized (curing-vaporizing process). In the case of using epoxy-based resin for the sealing member 30, the sealing member 30 is cured at a temperature approximately 150° C. In the case of using PEG for the resin 50, the resin 50 is vaporized at a temperature in a range of approximately 100° C. to 300° C., for example. By performing heating treatment with the use of an oven, a heater or the like, the process after the sealing process can be performed.

In the case where the curing temperature is approximately same with the vaporizing temperature, curing of the sealing member 30 and vaporizing of the resin 50 may be performed at the same time. In the case where the curing temperature differs from the vaporizing temperature, curing of the sealing member 30 and vaporizing of the resin 50 may be performed at different times, for example, one is performed firstly and then the other is performed.

Figure 1C:
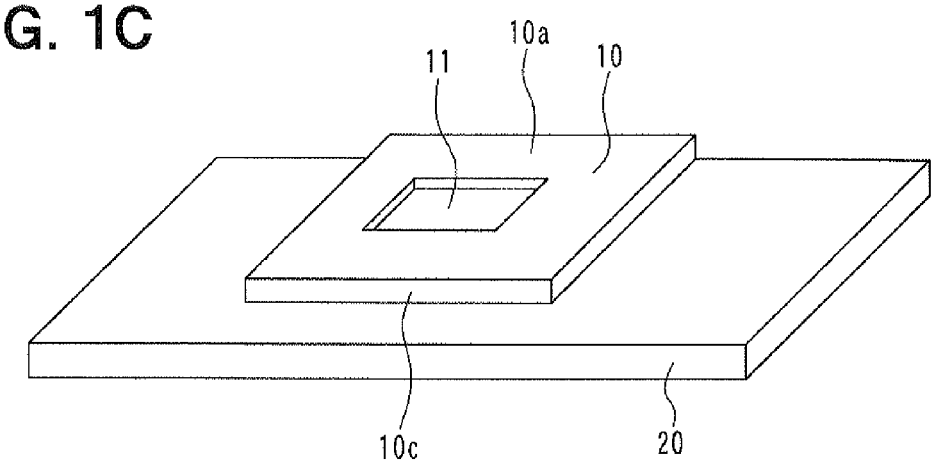
FIG. 1C is a perspective view showing the sensor device in FIG. 1A in which a sealing member is omitted.

When the resin 50 is heated to be vaporized, vaporized resin 50, that is, gasified resin 50 is discharged through the sensing portion 11 as the unsealed portion. Thus, the void 40 is formed between the side surface 10c and the sealing member 30 that covers the side surface 10c so that the sensor device S1 of the present embodiment shown in FIGS. 1A to 1C is formed.

According to the present embodiment, after the sealing process by the sealing member 30, the resin 50 is vaporized to form the void 40 between the surface of the sensor chip 10 and the sealing member 30 that covers the surface of the sensor chip 10. In the conventional sensor device, the sealing member 30 covers the surface of the sensor chip 10 such that the surface is in contact with the sealing member 30. In contrast, in the sensor device S1 of the present embodiment, the sealing member 30 covers the surface of the sensor chip 10 with a space interposed therebetween.

Adhesive force between the sealing member 30 and the sensor chip 10 is drastically reduced, or becomes substantially zero. Therefore, stress generated to the sensor chip 10 from the sealing member 30 can be reduced as much as possible.

Accordingly, in the present embodiment, a material for the sealing member 30 can be selected in consideration of an innate property of the sealing member 30, for example, heat resistance. That is, the material may be selected without considering whether the material has low elasticity or not. Thus, in the present embodiment, epoxy-based resin, which is a common material, can be selected as the sealing member 30 without using silicone resin, which has a problem with reliability although having low elasticity.

Further, in the sealing process, the sensing portion 11 in the surface of the sensor chip 10 is formed as the unsealed portion that is a hole opening into the outside from the inside of the sealing member 30. In the curing-vaporizing process, the gasified resin 50 is discharged from the inside of the sealing member 30 through the sensing portion 11. Thus, pressure increase inside the sealing member 30 by vaporizing the resin 50 can be easily restricted.

Figure 3:
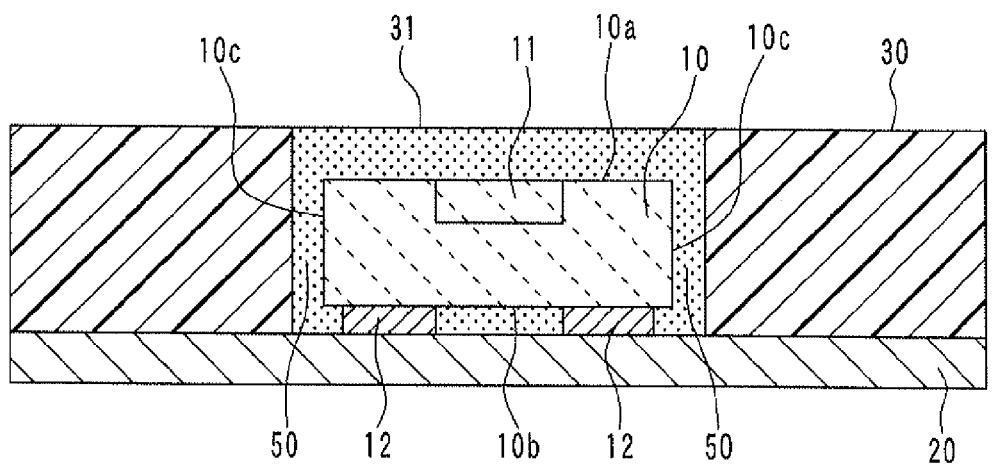
FIG. 3 is a cross-sectional view showing a sensor device according to a first modified example of the first embodiment.
Figure 4:
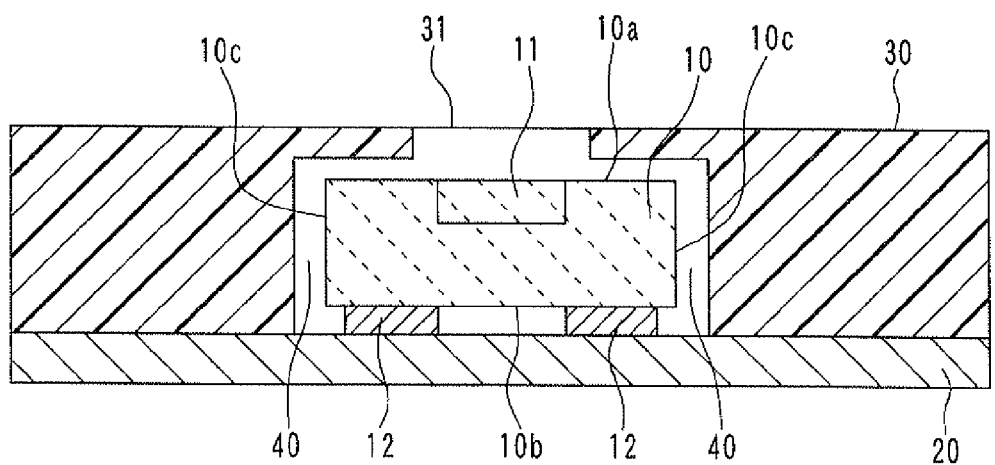
FIG. 4 is a cross-sectional view showing a sensor device according to a second modified example of the first embodiment.

Next, first and second modified examples of the first embodiment will be described with reference to FIGS. 3 and 4. In the following examples and embodiments, with respect to the corresponding portion to the first embodiment, the same reference numeral is designated and a description thereof will not be repeated.

According to FIGS. 2A to 2D, in the resin applying process, the resin 50 is applied to the side surface 10c of the sensor chip 10, but is not applied to the upper surface 10a of the sensor chip 10. In contrast, as shown in FIG. 3, the resin 50 may be applied to and cover the whole surface of the upper surface 10a in addition to the side surface 10c. In this case, the resin 50 is vaporized to be removed, and the configuration shown in FIGS. 1A to 1C can be obtained.

According to FIGS. 1A to 1C, the whole surface of the upper surface 10a including the sensing portion 11 in the surface of the sensor chip 10 is exposed to the outside to provide the unsealed portion. As shown in FIG. 4, the sensing portion 11 in the upper surface 10a may be exposed to the outside, and a peripheral portion thereof may be covered by the sealing member 30 via the void 40. In this case, the sensing portion 11 is exposed to the outside and detection by the sensing portion 11 can be performed. Further, the vaporized resin 50 can be discharged as described above.

Second Embodiment

In the first embodiment, the sensor chip 10 is mounted on the upper surface of the substrate 20 by the flip-chip bonding. In contrast, wire bonding is used in the present embodiment in place of the flip-chip bonding. The difference will be described in the present embodiment.

Figure 5A:
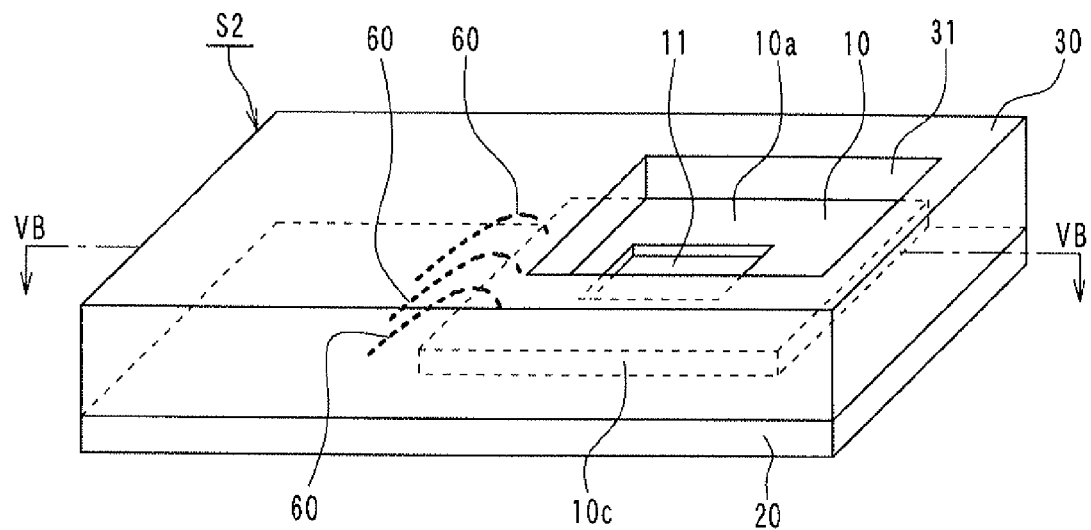
FIG. 5A is a perspective view showing a sensor device according to a second embodiment of the present invention.
Figure 5B:
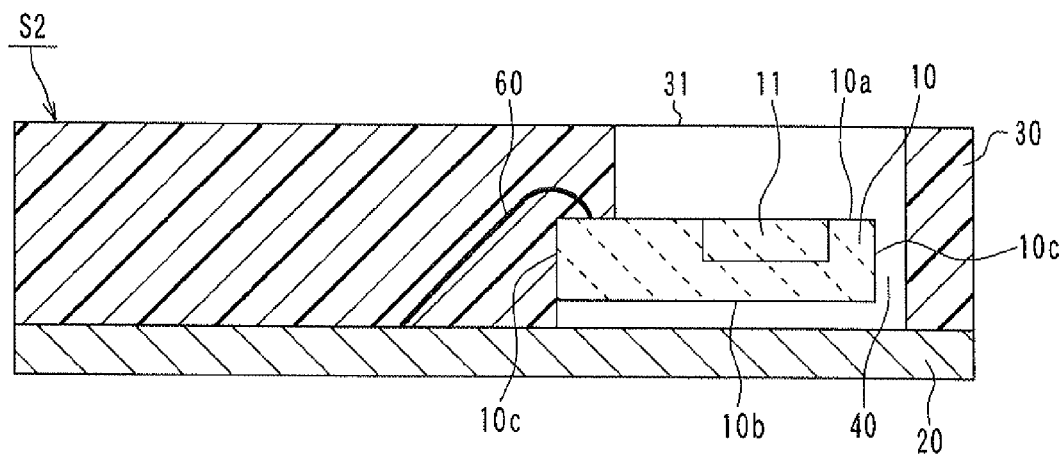
FIG. 5B is a cross-sectional view taken along a line VB-VB in FIG. 5A.

As shown in FIGS. 5A and 5B, the sensor chip 10 is mounted over the upper surface of the substrate 20 with the lower surface 10b being separated from and opposed to the substrate 20. In the present embodiment, the side surface 10c and a part of the upper surface 10a are in direct contact with the sealing member 30 so that the sensor chip 10 is sealed.

In the present embodiment, the sensing portion 11 is arranged on the upper surface 10a and is exposed to the outside. However, in the case of the present embodiment, the sensing portion 11 is located nearer one end portion (i.e., a right end portion in FIGS. 5A and 5B) of the upper surface 10a. The sealing member 30 adheres tightly to a portion nearer the other end portion (i.e., a left end portion in FIGS. 5A and 5B) of the upper surface 10a, which is located farther from the sensing portion 11.

The sensor chip 10 is fixed by adhesive force of the sealing member 30 that adheres tightly thereto, and is disposed to be separated from the upper surface of the substrate 20. The portion of the sensor chip 10 fixed by the sealing member 30 is located at the portion nearer the other end portion of the upper surface 10a, as described above. That is, the sensor chip 10 is supported by the sealing member 30 in a cantilever fashion.

As shown in FIGS. 5A and 5B, a part of the side surface 10c covered by the sealing member 30 adheres tightly to the sealing member 30, and the void 40 is provided between the other part of the side surface 10c and the sealing member 30. A space between the lower surface 10b and the upper surface of the substrate 20 opens into the sensing portion 11 of the upper surface 10a via the void 40, and further opens into the outside via the sensing portion 11.

A bonding wire 60 is connected to the portion nearer the other end portion of the upper surface 10a. The bonding wire 60 is formed by common gold and aluminum wire bonding, and connects the sensor chip 10 to the upper surface of the substrate 20. Thus, the sensor chip 10 is electrically connected to the substrate 20. The bonding wire 60 as an electrically connection portion is sealed by the sealing member 30.

Figure 6A:
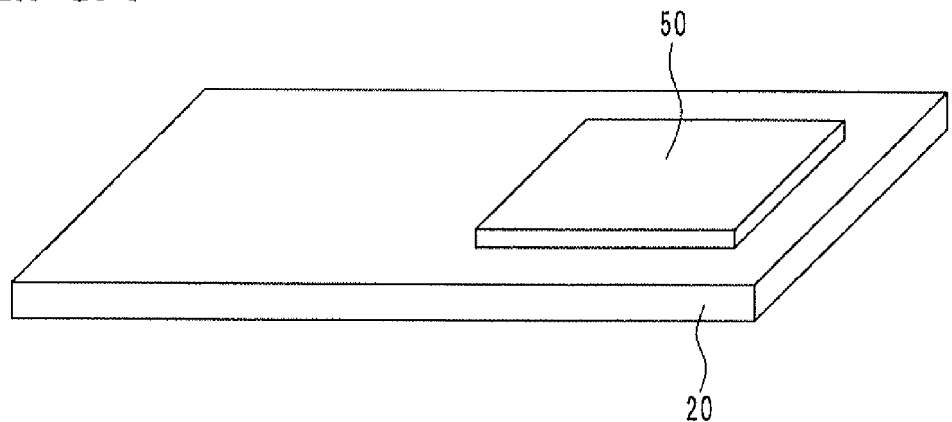
FIGS. 6A to 6C are views showing processes for manufacturing the sensor device in FIG. 5A.
Figure 6B:
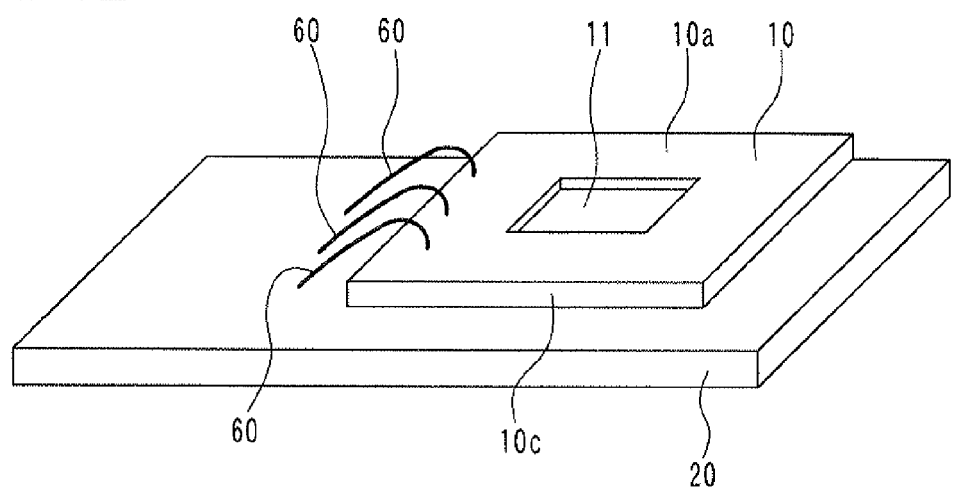
Figure 6C:
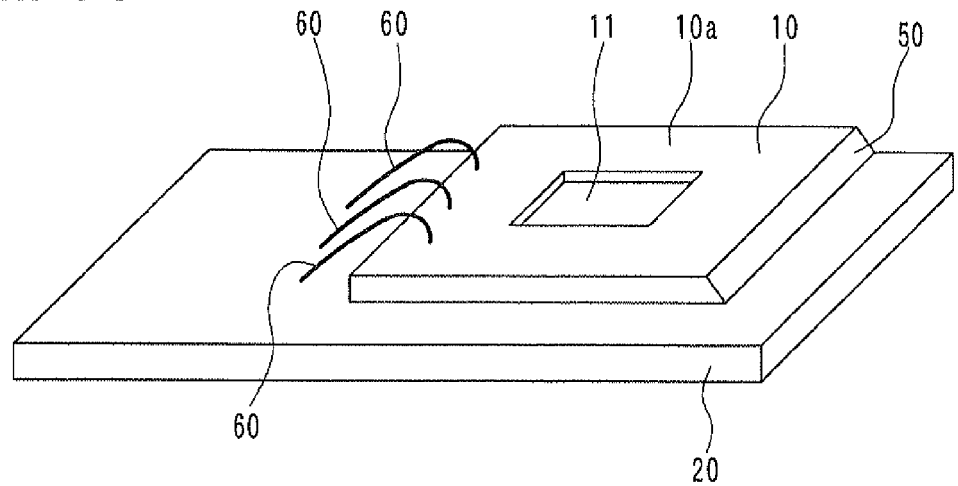

Next, a manufacturing method of a sensor device 52 shown in FIGS. 5A and 5B will be described with reference to FIGS. 6A to 6C. FIGS. 6A to 6C are perspective views showing the respective processes.

As shown in FIG. 6A, firstly, as a first resin applying process, the volatile resin 50 is applied to a position of the upper surface of the substrate 20, on which the sensor chip 10 will be mounted, by a dispenser or the like. The resin 50 may be the same resin used in the first embodiment.

After that, as shown in FIG. 6B, the sensor chip 10 is mounted on the resin 50 (sensor chip mounting process). Then, the bonding wire 60 is formed between the upper surface 10a of the sensor chip 10 and the upper surface of the substrate 20 by the wire bonding (wire bonding process).

Next, as shown in FIG. 6C, as a second resin applying process, the resin 50 is arranged on the side surface 10c other than a portion, over which the bonding wire 60 crosses.

For example, the sensor chip 10 having a rectangular-plate shape has four side surfaces 10c. In the present embodiment, the bonding wire 60 crosses over one of the four side surfaces 10c. Thus, the resin 50 is arranged on the other three side surfaces 10c.

The resin 50 arranged on the side surface 10c bonds to the resin 50 below the lower surface 10b, which is applied in the first resin applying process, thereby the resin 50 is continuously arranged from the lower surface 10b to the side surface 10c. Therefore, in the respective resin applying processes, the resin 50 is arranged on the surface of the sensor chip 10 other than the portion to which the sealing member 30 adheres.

After arranging the resin 50, the sensor chip 10 and the upper surface of the substrate 20 are sealed by the sealing member 30. In a sealing process of the present embodiment, the sensing portion 11 is made to be the unsealed portion, and the side surface 10c and the portion nearer the other end portion of the upper surface 10a are covered by the sealing member 30.

In the surface of the sensor chip 10 covered by the sealing member 30, the sealing member 30 directly adheres to a part of the side surface 10c and the portion nearer the other end portion of the upper surface 10a, on which the resin 50 is not arranged, and the sealing member 30 covers the other part of the side surface 10c via the resin 50.

The resin 50 sealed by the sealing member 30 in the sealing process is configured to communicate with the outside via the side surface 10c and the sensing portion 11 of the upper surface 10a. Thus, if the sealing member 30 is cured and the resin 50 is heated to be vaporized after the sealing process, the vaporized resin 50 is discharged through the sensing portion 11 also in the present embodiment.

Thus, the void 40 is formed between the side surface 10c and the sealing member 30 and the space between the lower surface 10b and the upper surface of the substrate 20 is formed so that the sensor device S2 shown in FIGS. 5A and 5B is formed.

The cured sealing member 30 adheres to the part of the side surface 10c and the portion nearer the other end portion of the upper surface 10a, and the sensor chip 10 is fixed to the upper surface of the substrate 20 by the adhesive force. Accordingly, in the present embodiment, the sensor chip 10 can be fixed to the substrate 20 without using a die-bonding material such as solder and conductive adhesive.

In the present embodiment, the surface of the sensor chip 10 covered by the sealing member 30 is separated from the sealing member 30. Therefore, stress generated to the sensor chip 10 from the sealing member 30 can be reduced as much as possible. Further, as in the first embodiment, by forming the sensing portion 11 of the sensor chip 10 as the unsealed portion, the pressure increase can be easily restricted.

Figure 7:
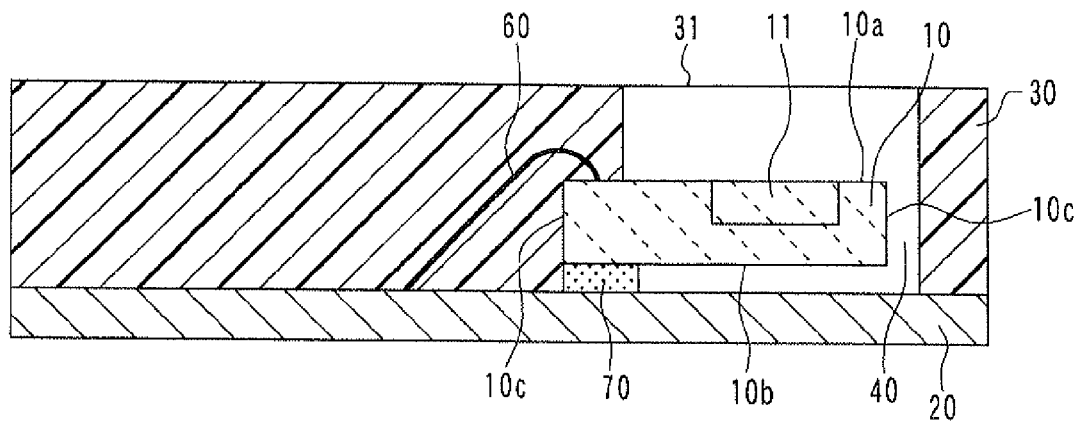
FIG. 7 is a cross-sectional view showing a sensor device according to a first modified example of the second embodiment.

Next, first and second modified examples of the second embodiment will be described with reference to FIGS. 7 and 8. As shown in FIG. 7, with respect to the sensor device S2 shown in FIG. 5B, a die-bonding material 70 such as solder and conductive adhesive may be further arranged between the lower surface 10b and the upper surface of the substrate 20. In this case, the adhesive force of the sealing member 30 for fixing the sensor chip 10 is obtained, and supporting strength in a cantilever supporting structure shown in FIG. 7 is ensured.

Figure 8:
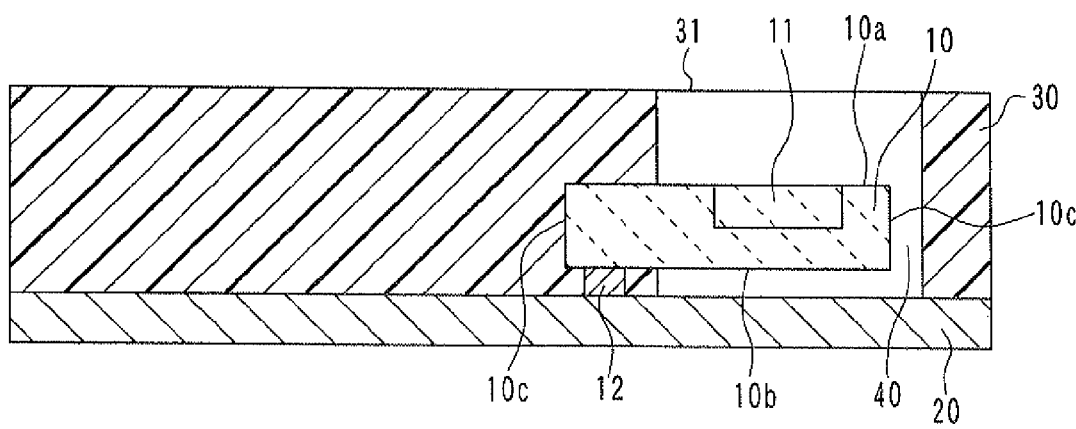
FIG. 8 is a cross-sectional view showing a sensor device according to a second modified example of the second embodiment.

FIG. 8 shows an example that the sensor device S2 is applied to a flip-chip structure. As shown in FIG. 8, the sealing member 30 adheres to the side surface 10c and the portion nearer the other end portion of the upper surface 10a, and the electrode 12 is connected to the substrate 20 at the lower surface 10b in the portion to which the sealing member 30 adheres. In the example shown in FIG. 8, the sensor chip 10 is fixed by the adhesive force of the sealing member 30, thereby supporting strength in a cantilever supporting structure is ensured.

The configurations shown in FIGS. 7 and 8 can be obtained by the following methods. For example, in the processes shown in FIGS. 6A to 6C, the die-bonding material 70 is arranged on the upper surface of the substrate 20 before the first resin applying process and the resin 50 is arranged thereon, or the electrode 12 penetrates the resin 50 to be connected to the substrate 20 after the first resin applying process.

In the second resin applying process shown in FIG. 6C, the resin 50 is practically applied to only the side surface 10c. Further, the resin 50 may be applied to the whole surface of the upper surface 10a. In this case, the resin 50 is vaporized to be removed, and the sensor device 52 having the configuration shown in FIGS. 5A and 5B is obtained.

In the processes shown in FIGS. 6A to 6C, the wire bonding process is performed after the first resin applying process and the sensor chip mounting process, and then, the second resin applying process is performed. However, the order of the wire bonding process and the second resin applying process may be reversed. That is, after the first resin applying process and the sensor chip mounting process, the second resin applying process is performed, and then, the wire bonding process is performed.

Third Embodiment

In the present embodiment, the sensor chip 10 is mounted on the upper surface of the substrate 20 by the wire bonding. However, an exposed configuration of the sensing portion 11 in the present embodiment is different from that in the second embodiment. The difference will be described in the present embodiment.

Figure 9A:
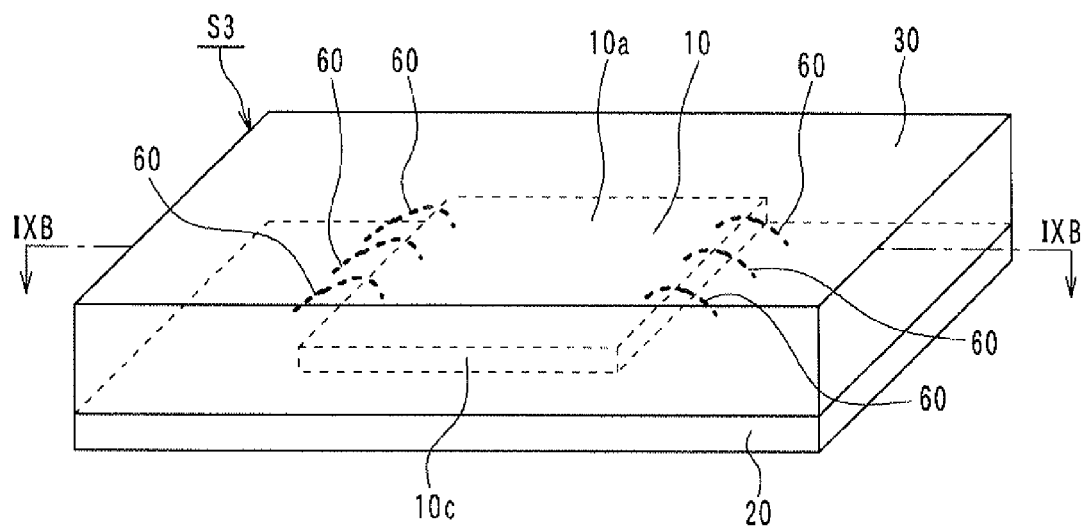
FIG. 9A is a perspective view showing a sensor device according to a third embodiment of the present invention.
Figure 9B:
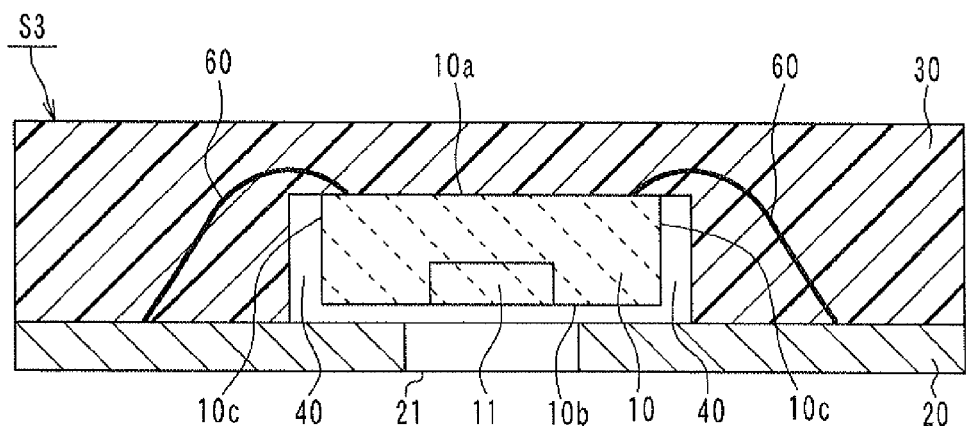
FIG. 9B is a cross-sectional view taken along a line IXB-IXB in FIG. 9A.

As in the second embodiment, the sealing member 30 adheres to a part of the surface of the sensor chip 10 so that the sensor chip 10 is fixed by the adhesive force. As shown in FIGS. 9A and 9B, the sealing member 30 adheres to substantially the whole surface of the upper surface 10a of the sensor chip 10, and the sensor chip 10 is supported with the lower surface 10b of the sensor chip 10 being separated from the upper surface of the substrate 20.

In the present embodiment, the sensing portion 11 is arranged on the lower surface 10b that is opposed to the upper surface of the substrate 20 instead of being arranged on the upper surface 10a. The substrate 20 has a through-hole 21 that penetrates the substrate 20 in a thickness direction thereof. The though-hole 21 is located at a portion on which the sensor chip 10 is mounted, that is, a portion that is opposed to the lower surface 10b of the sensor chip 10, in the upper surface of the substrate 20.

An aperture size of the through-hole 21 is smaller than a planar size of the sensor chip 10. The through-hole 21 penetrates the substrate 20 from the upper surface to a surface opposite to the upper surface (a lower surface of the substrate 20 shown in FIG. 9B). The thorough-hole 21 is formed by a boring process with pressing or etching. An aperture shape of the through-hole 21 may be a circular shape or a square shape, and is not limited thereto.

The through-hole 21 is covered by the sensor chip 10 at a side of the upper surface of the substrate 20. The sensing portion 11 faces toward the outside at a side of the lower surface of the substrate 20 through the through-hole 21.

As described above, in the present embodiment, the sensing portion 11 is arranged on the lower surface 10b, and the lower surface 10b including the sensing portion 11 is an exposed portion that is exposed to the outside through the through-hole 21. Therefore, in the present embodiment, detection by the sensing portion 11 can be performed with the sensing portion 11 being exposed to the outside as the unsealed portion.

The bonding wire 60 connects the upper surface 10a to the upper surface of the substrate 20. The bonding wire 60 extends from the upper surface 10a to the upper surface of the substrate 20 with passing over the side surface 10c.

In the present embodiment, the bonding wire 60 is entirely sealed by the sealing member 30, and the side surface 10c and the sealing member 30 that covers the side surface 10c are arranged with the void 40 interposed therebetween. The void 40 opens into the outside via a space between the lower surface 10b and the upper surface of the substrate 20, and the through-hole 21.

Figure 10A:
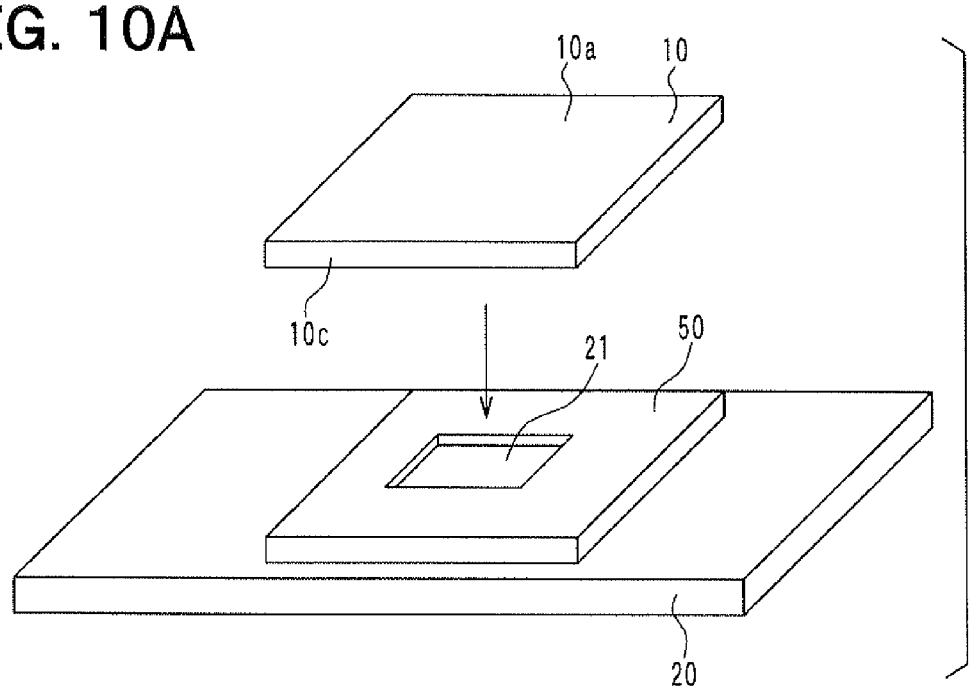
FIGS. 10A to 10C are views showing processes for manufacturing the sensor device in FIG. 9A.
Figure 10B:
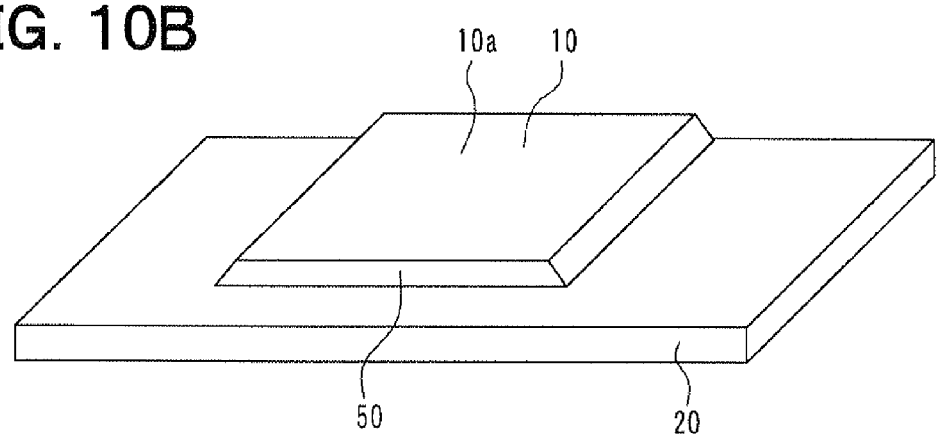
Figure 10C:
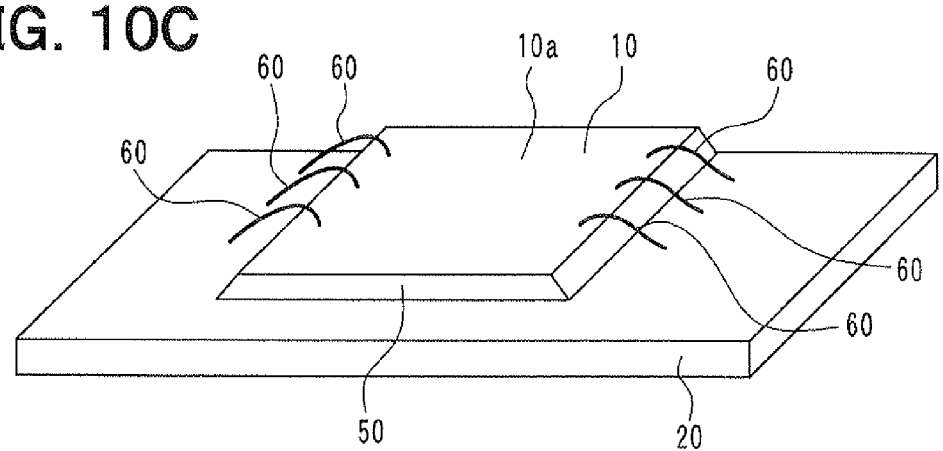

Next, a manufacturing method of a sensor device S3 shown in FIGS. 9A and 9B will be described with reference to FIGS. 10A to 10C. FIGS. 10A to 10C are perspective views showing the respective processes.

As shown in FIG. 10A, the through-hole 21 is formed at the position of the upper surface of the substrate 20, on which the sensor chip 10 will be mounted. After that, as the first resin applying process, the volatile resin 50 is applied to a peripheral portion, i.e., an edge portion of the through-hole 21 at the upper surface of the substrate 20. Then, the sensor chip 10 is mounted on the resin 50 so that the through-hole 21 is covered by the sensor chip 10.

Next, as shown in FIG. 10B, as the second resin applying process, the resin 50 is arranged on the side surface 10c. In this case, the resin 50 is arranged on the four side surfaces 10c in the rectangular-plate-shaped sensor chip 10.

Thus, the resin 50 applied in the first and second resin applying processes is continuously arranged from the lower surface 10b to the side surface 10c, and faces toward the outside through the through-hole 21 from the side of the upper surface of the substrate 20.

After that, as shown in FIG. 10C, the wire bonding process is performed between the upper surface 10a and the upper surface of the substrate 20 to form the bonding wire 60. The second resin applying process may be performed after the wire bonding process. In this case, the resin 50 is arranged between adjacent bonding wires 60 or the resin 50 is not arranged on the side surface 10c over which the bonding wire 60 crosses so as to prevent the resin film 50 from adhering to the bonding wire 60.

Then, the sensor chip 10 and the upper surface of the substrate 20 are sealed by the sealing member 30. The sensor chip 10 is arranged such that the sensing portion 11 on the lower surface 10b is exposed to the outside through the through-hole 21 of the substrate 20, thereby the sensing portion 11 becomes the unsealed portion.

The sealing member 30 is cured, and the resin 50 is heated to be vaporized. As described above, because the resin 50 is exposed to the outside through the through-hole 21, the vaporized resin 50 is discharged from the through-hole 21 via the sensing portion 11 on the lower surface 10b.

Thus, the void 40 between the side surface 10c and the sealing member 30 and the space between the lower surface 10b and the substrate 20 are formed, thereby the sensor device S3 shown in FIGS. 9A and 9B is formed. Also in the present embodiment, by separating the surface of the sensor chip 10 and the sealing member 30, stress can be reduced as described above.

According to the present embodiment, although the sensor chip 10 is entirely sealed by the sealing member 30 at the side of the upper surface of the substrate 20, the vaporized resin 50 is discharged from the side of the lower surface of the substrate 20 through the through-hole 21. Thus, pressure increase inside the sealing member 30 by vaporizing the resin 50 can be easily restricted.

Figure 11:
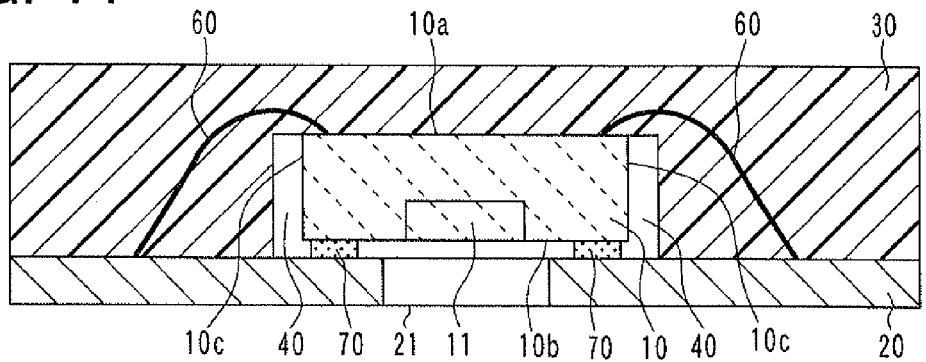
FIG. 11 is a cross-sectional view showing a sensor device according to a modified example of the third embodiment.

A modified example of the third embodiment will be described with reference to FIG. 11. As shown in FIG. 11, with respect to the sensor device S3 shown in FIG. 9B, the die-bonding material 70 may be further arranged between the lower surface 10b and the upper surface of the substrate 20. In this case, for example, in the process shown in FIG. 10A, after the die-bonding material 70 is arranged on the upper surface of the substrate 20, the resin 50 may be arranged so as not to be in contact with the die-bonding material 70.

Fourth Embodiment

In the present embodiment, the sensing portion 11 is exposed to the outside through the through-hole 21 of the substrate 20, as in the third embodiment. However, the sensor chip 10 is mounted on the upper surface of the substrate 20 by the flip-chip bonding. The difference will be described in the present embodiment.

Figure 12A:
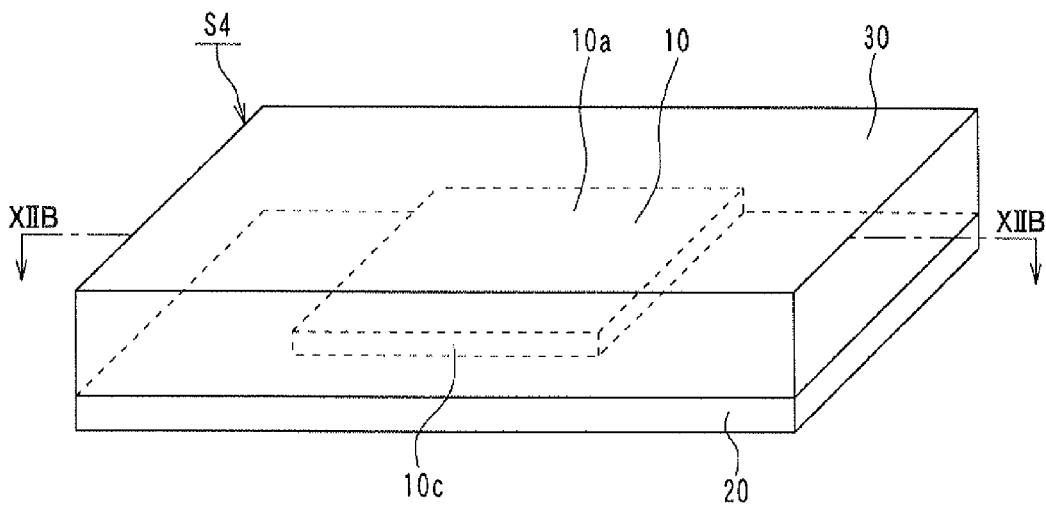
FIG. 12A is a perspective view showing a sensor device according to a fourth embodiment of the present invention.
Figure 12B:
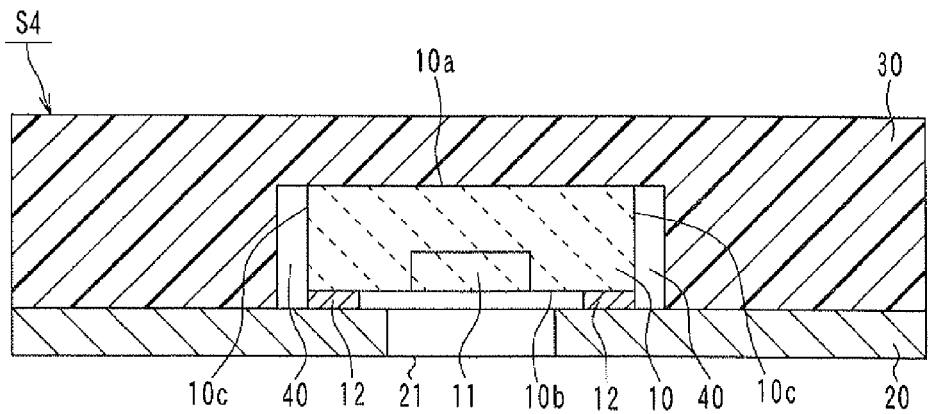
FIG. 12B is a cross-sectional view taken along a line XIIB-XIIB in FIG. 12A.

As shown in FIG. 12B, the sensor chip 10 includes the sensing portion 11 and the electrode 12 on the lower surface 10b that is opposed to the substrate 20, and is mounted on the upper surface of the substrate 20 via the electrode 12. The sensor chip 10 is electrically and mechanically connected to the substrate 20 via the electrode 12.

The sensor chip 10 is supported by the substrate 20 via the electrode 12. As in the third embodiment, the sealing member 30 adheres to the upper surface 10a so that the sensor chip 10 is fixed by the adhesive force of the sealing member 30.

A sensor device S4 of the present embodiment can be obtained from the sensor device S3 by replacing the bonding wire 60 in the sensor device S3 with the electrode 12. Other configurations, for example, a sealing configuration of the sealing member 30 including the void 40 or the space, a positional relationship between the through-hole 21 and the sensing portion 11 are same with those in the third embodiment.

Figure 13A:
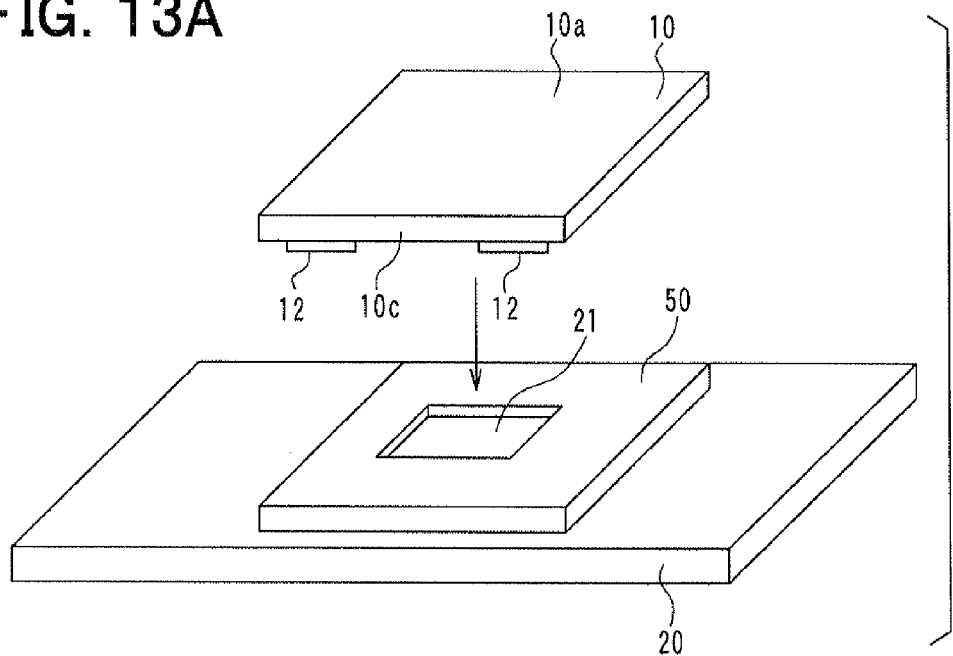
FIGS. 13A and 13B are views showing processes for manufacturing the sensor device in FIG. 12A.
Figure 13B:
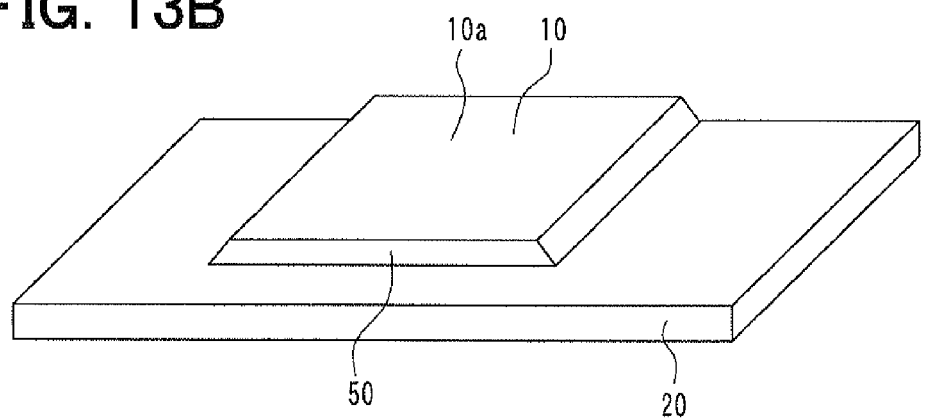

Next, a manufacturing method of the sensor device S4 shown in FIGS. 12A and 12B will be described with reference to FIGS. 13A and 13B. FIGS. 13A and 13B are perspective views showing the respective processes.

Firstly, as shown in FIG. 13A, as the first resin applying process, the resin 50 is applied to the upper surface of the substrate 20 having the through-hole 21 as described above. Further, the sensor chip 10 having the electrode 12 on the lower surface 10b thereof is prepared. The sensor chip 10 is mounted on the resin 50 with the lower surface 10b being opposed to the upper surface of the substrate 20, and the through-hole 21 is covered by the sensor chip 10. The sensor chip 10 may be mounted such that the electrode 12 penetrates the resin 50 to be connected to the substrate 20.

Next, as shown in FIG. 13B, as the second resin applying process, the resin 50 is arranged on the side surface 10c as described above. In this manner, the sensor chip 10 is mounted such that the lower surface 10b including the sensing portion 11 is exposed to the outside through the through-hole 21 as the unsealed portion, and the resin 50 is arranged so as to be exposed to the outside through the through-hole 21.

After that, the sensor chip 10 and the upper surface of the substrate 20 are sealed by the sealing member 30. Next, the sealing member 30 is cured, and the resin 50 is heated to be vaporized. The vaporized resin 50 is discharged from the through-hole 21 so that the void 40 between the side surface 10c and the sealing member 30 and the space between the lower surface 10b and the substrate 20 are formed.

Therefore, the sensor device S4 shown in FIGS. 12A and 12B is formed. Also in the present embodiment, by separating the surface of the sensor chip 10 and the sealing member 30, stress can be reduced as described above. Further, pressure increase inside the sealing member 30 when the resin 50 is vaporized can be restricted by the through-hole 21.

Figure 14:
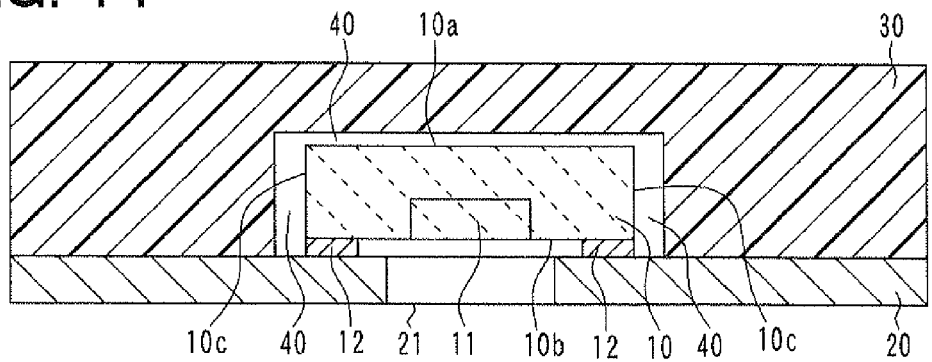
FIG. 14 is a cross-sectional view showing a sensor device according to a modified example of the fourth embodiment.

A modified example of the fourth embodiment will be described with reference to FIG. 14. As shown in FIG. 14, with respect to the sensor device S4 shown in FIG. 12B, the void 40 is further provided between the upper surface 10a and the sealing member 30 that covers the upper surface 10a.

That is, as with the sensor device S1 shown in FIG. 1B, the whole surface of the sensor chip 10 mounted by the flip-chip bonding is not substantially in contact with the sealing member 30. Because the sensor chip 10 is supported by the substrate 20 via the electrode 12, the sensor chip 10 does not need to be fixed by the adhesive force of the sealing member 30.

By arranging the resin 50 on the upper surface 10a in addition to the side surface 10c in the second resin applying process shown in FIG. 13B, the sensor device shown in FIG. 14 is formed.

Further, in the sensor device shown in FIG. 14, the sensing portion 11 may be arranged on the upper surface 10a. In this case, the sensing portion 11 communicates with the outside through the through-hole 21. Therefore, detection of a pressure of the outside or the like can be performed appropriately.

Fifth Embodiment

The present embodiment differs from the above embodiments in that the unsealed portion from which the vaporized resin 50 is discharged is arranged on a portion other than the sensing portion 11 in the surface of the sensor chip 10.

Figure 15A:
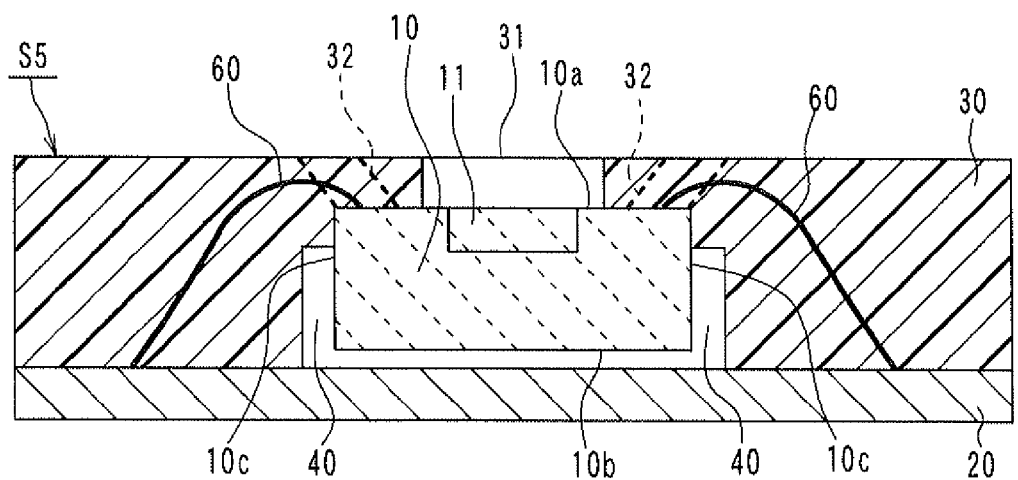
FIG. 15A is a perspective view showing a sensor device according to a fifth embodiment of the present invention.

As with the example shown in FIG. 5B, in an example of FIG. 15A, the sensing portion 11 is arranged on the upper surface 10a of the sensor chip 10, the sensor chip 10 is fixed to the substrate 20 by adhesion between the upper surface 10a and the sealing member 30, and the sensor chip 10 is mounted by the wire bonding.

Figure 15B:
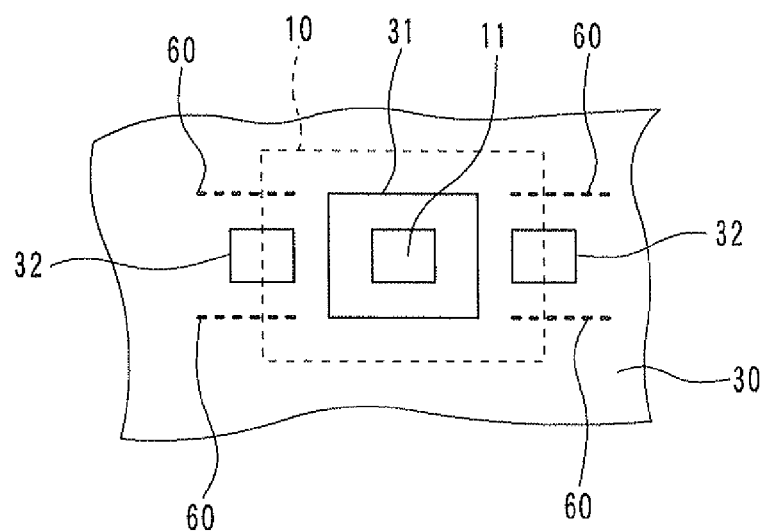
FIG. 15B is a top view showing a region near a sensing portion of the sensor device in FIG. 15A.
Figure 16A:
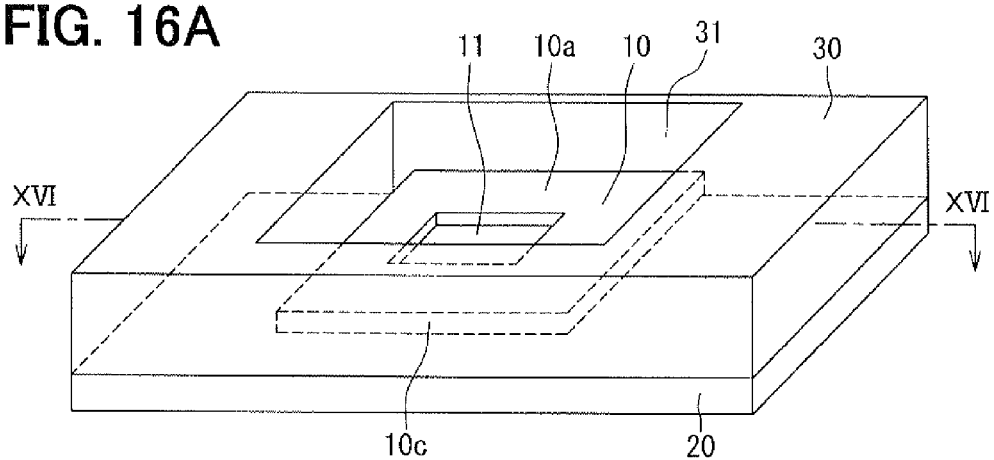
FIG. 16A is a perspective view showing a sensor device according to another modified example of the first embodiment.
Figure 16B:
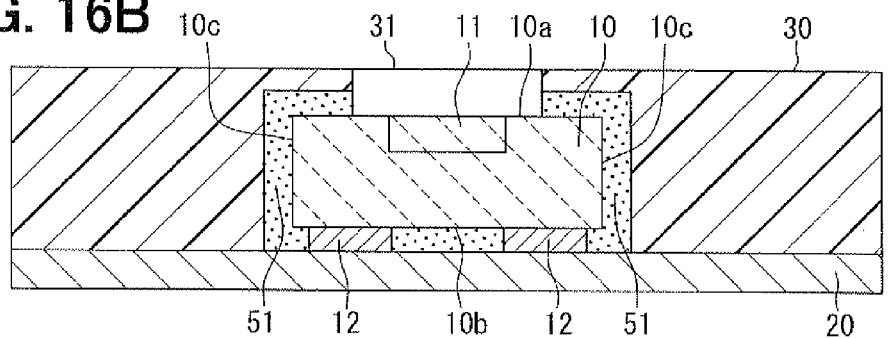
FIGS. 16B to 16D are cross-sectional views taken along a line XVI-XVI in FIG. 16A.
Figure 16C:
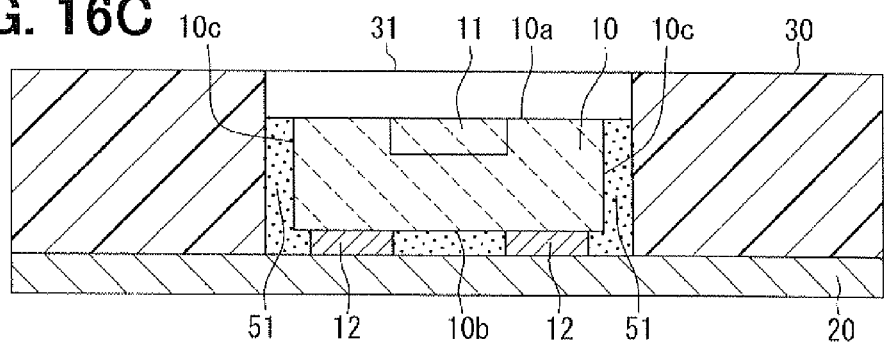
Figure 16D:
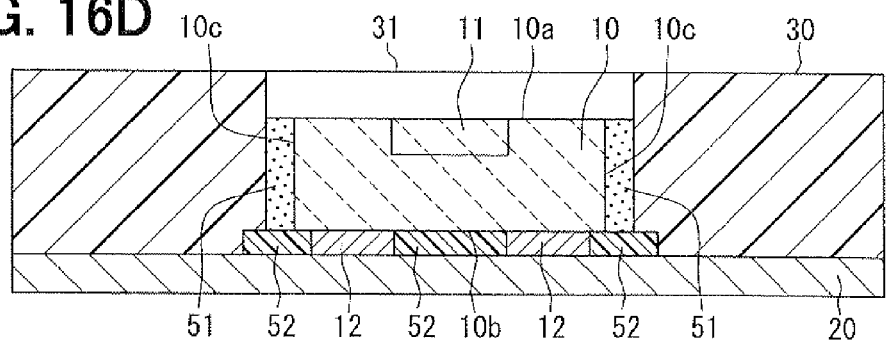
Figure 17A:
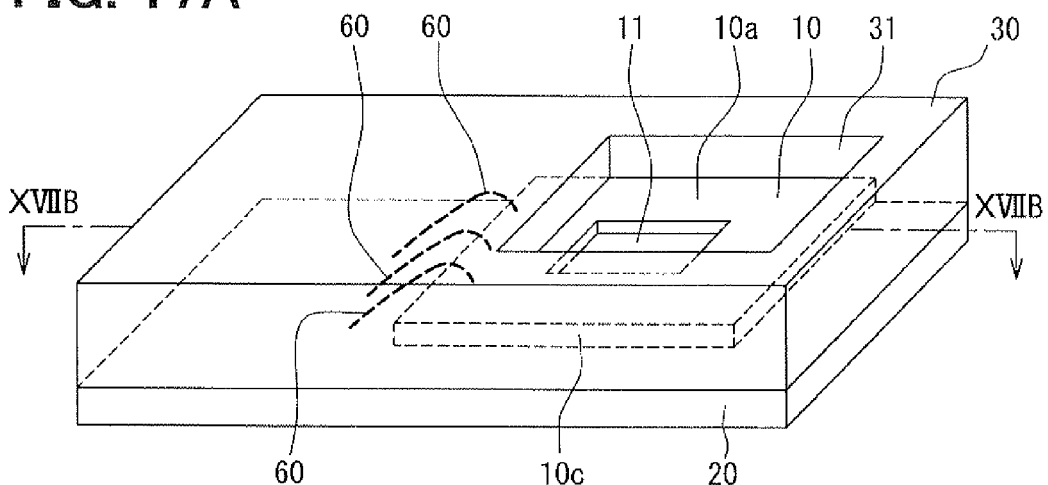
FIG. 17A is a perspective view showing a sensor device according to another modified example of the second embodiment.
Figure 17B:
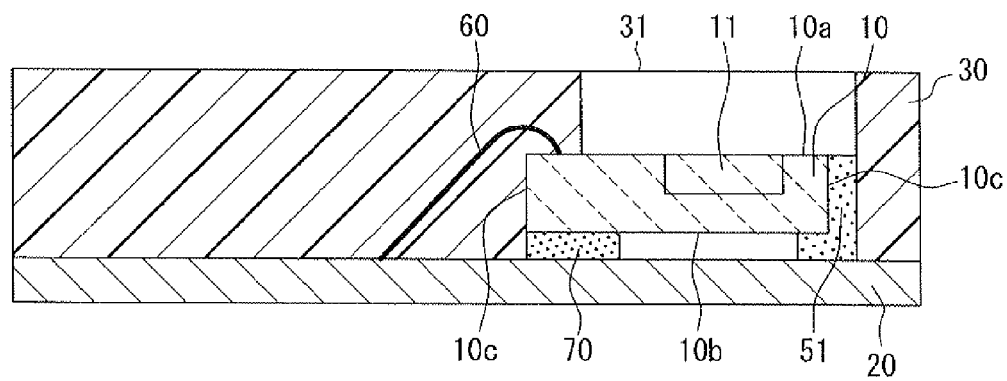
FIG. 17B is a cross-sectional view taken along a line XVIIB-XVIIB in FIG. 17A.
Figure 17C:
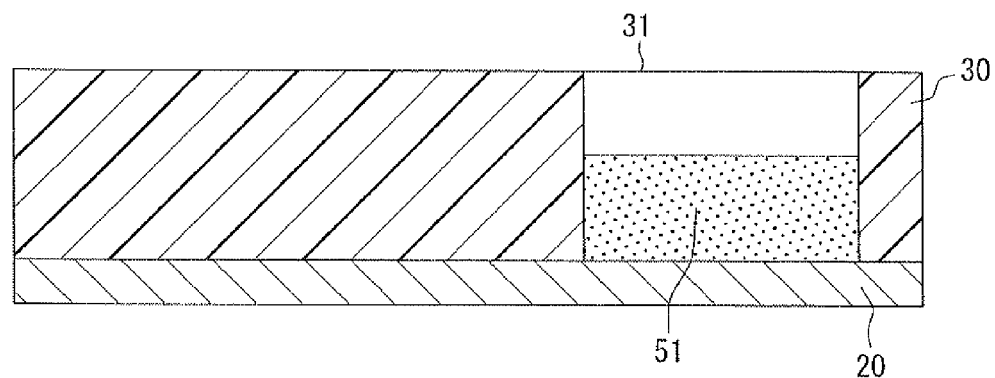
FIG. 17C is a cross-sectional view taken along a line XVIIC-XVIIC in FIG. 17A.
Figure 18A:
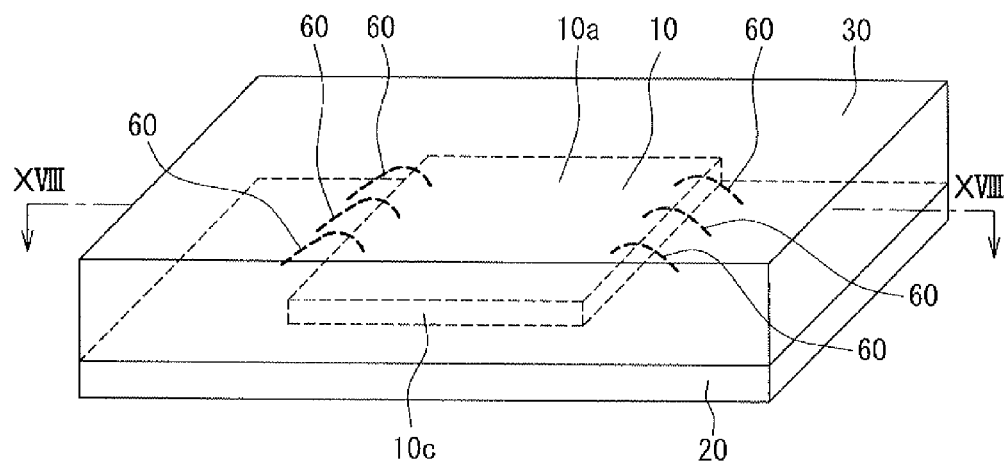
FIG. 18A is a perspective view showing a sensor device according to another modified example of the third embodiment.
Figure 18B:
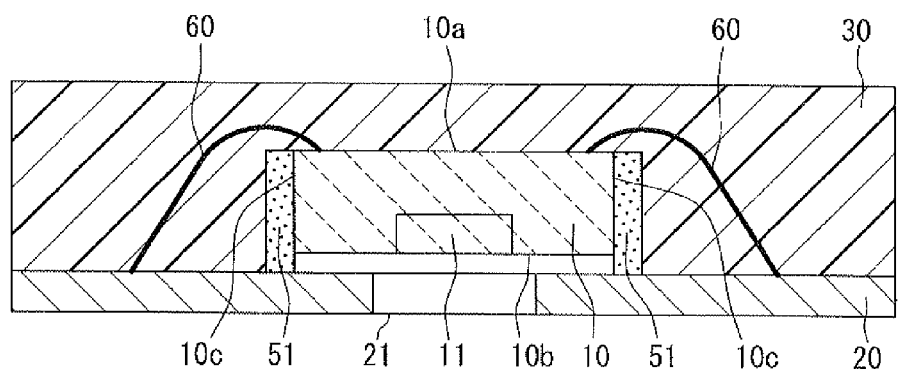
FIGS. 18B and 18C are cross-sectional views taken along a line XVIII-XVIII in FIG. 18A.
Figure 18C:
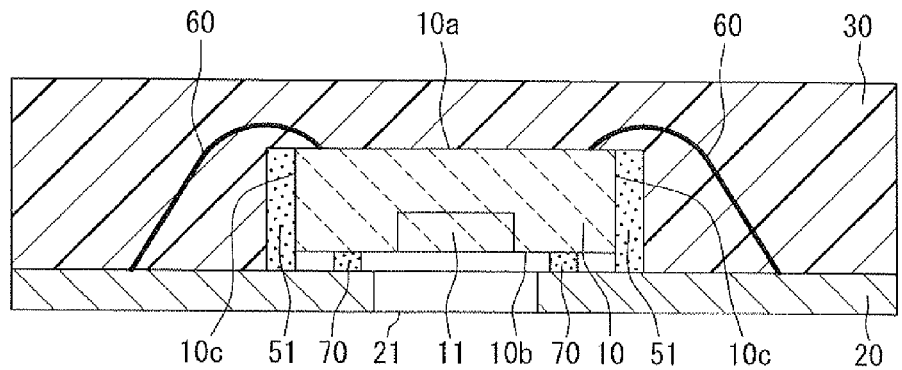
Figure 19A:
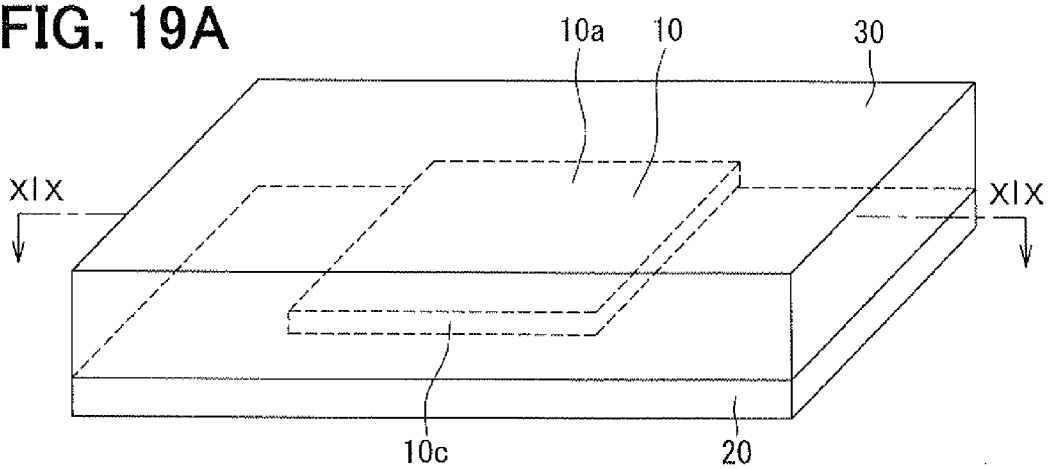
FIG. 19A is a perspective view showing a sensor device according to another modified example of the fourth embodiment.
Figure 19B:
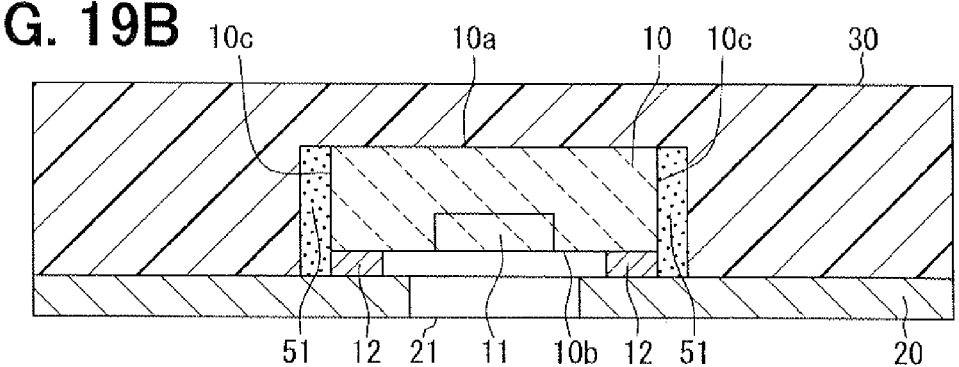
FIGS. 19B and 19C are cross-sectional views taken along a line XIX-XIX in FIG. 19A.
Figure 19C:
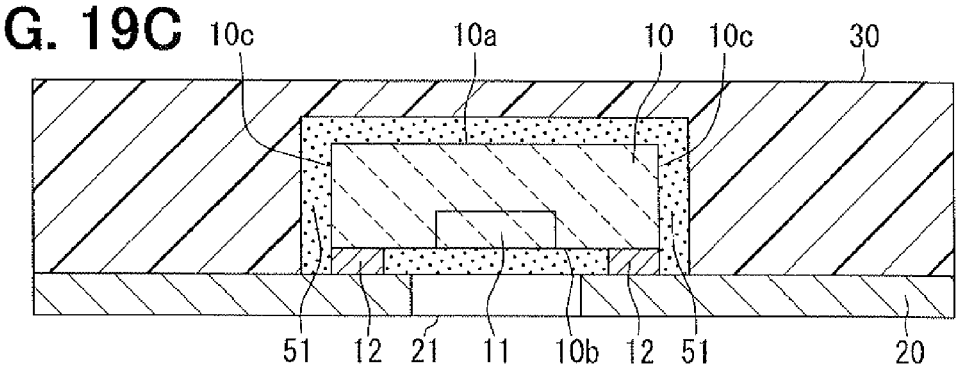
Figure 20:
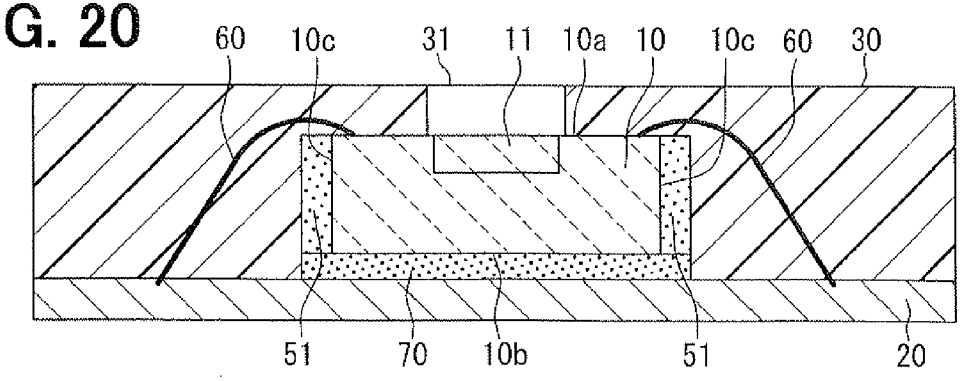
FIG. 20 is a cross-sectional view showing a sensor device according to another modified example of the sensor device in FIG. 16A.

In the present embodiment, as shown in FIGS. 15A and 15B, a peripheral portion of the sensing portion 11 in the upper surface 10a is exposed to the outside via an opening 32 provided in the sealing member 30, that is, the peripheral portion is the unseal portion.

The opening 32 is provided just above the peripheral portion in the upper surface 10a and the side surface 10c adjacent to the peripheral portion. The peripheral portion and the side surface 10c face toward the outside through the opening 32. The void 40 between the side surface 10c and the sealing member 30 communicates with the outside via the opening 32.

The sensing portion 11 of the sensor chip 10 is exposed to the outside through another opening 31, which is arranged on a portion of the sealing member 30 just above the sensing portion 11. However, the sensing portion 11 does not communicate with the void 40. That is, the opening 31 is used for exposing the sensing portion 11 to the outside, and is not used for discharging the vaporized resin 50.

A manufacturing method of a sensor device S5 of the present embodiment is as follows. For example, according to the manufacturing method shown in FIGS. 6A to 6C, the resin 50 is applied to the substrate 20, the sensor chip 10 is mounted on the substrate 20, the wire bonding is performed, the resin 50 is applied to the side surface 10c of the sensor chip 10, and then, these components are sealed by the sealing member 30 such that the openings 31 and 32 are formed.

After that, the sealing member 30 is cured and the resin 50 is vaporized so that the vaporized resin 50 on the side surface 10c passes through the surface of the sensor chip 10 as the unsealed portion and is discharged from the opening 32.

Thus, the void 40 is formed, and the sensor device S5 of the present embodiment is formed. Also in the present embodiment, stress generated to the sensor chip 10 from the sealing member 30 can be reduced, and pressure increase inside the sealing member 30 when the resin 50 is vaporized can be restricted.

In the example shown in FIGS. 15A and 15B, the flip-chip bonding may be used in place of the wire bonding. Further, the sensor chip 10 may be fixed by the die-bonding material 70 without using the adhesive force of the sealing member 30.

In the present embodiment, a component other than the sensing portion 11 may be used as the unsealed portion in the surface of the sensor chip 10. For example, in FIGS. 15A and 15B, the sensing portion 11 may be arranged on the lower surface 10b.

Further, in the present embodiment, by providing the opening 32 in the sealing member 30, the unsealed portion other than the sensing portion 11 is formed. However, as shown in FIGS. 9A to 14, the unsealed portion other than the sensing portion 11 may be formed by providing the through-hole 21 in the substrate 20. As an example of this case, the sensing portion 11 is arranged on the upper surface 10a in the example of FIG. 14. In this case, the lower surface 10b without the sensing portion 11 becomes the unsealed portion.

Other Embodiments

Although volatile resin is used as the resin 50 in the above embodiments, foam resin 51 such as foamable polystyrene may be used. In this case, the resin 50 is heated to be foamed after sealing by the sealing member 30 so that the foamed portion becomes the void 40 between the sealing member 30 and a portion covered by the sealing member 30 in the surface of the sensor chip 10. Thus, the similar effect can be obtained in the case of using volatile resin. As shown in FIGS. 16A to 20, the foam resin 51 may be arranged in place of the volatile resin 50. It is to be noted that a reference numeral 52 in FIGS. 16C and 16D indicates the underfill resin.

Although a pressure inside the sealing member 30 may be increased by volatilization or expansion of the resin 50, the above-described unsealed portion does not need to be provided. That is, as long as the void 40 is provided between the sensor chip 10 and the sealing member 30, the sensor chip 10 may be entirely covered by the sealing member 30, for example. In this case, the outside of the sealing member 30 is maintained as a vacuum so that the pressure inside the sealing member 30 can be leaked.

In the manufacturing method in each of the above embodiments, a process that the sensor device may be formed in each wafer and the wafer is cut by die cutting may be used. In this case, the resin 50 may be applied by a spin coater or the like in the resin applying process.

If necessary, as the resin 50, a film resin made of volatile resin may be arranged. An example of a foam resin film includes REVALPHA (registered trademark) that is a thermal-foam-type adhesive tape manufactured by Nitto Denko Corporation.

In the above embodiments, the sealing member 30 is opposed to the surface of the sensor chip 10 covered by the sealing member 30 with the void 40 interposed therebetween. The void 40 is formed as a space remained after the resin 50 is removed in the manufacturing process. Therefore, by adjusting a position, a configuration or the like of the resin 50, a position and a configuration of the void 40 can be appropriately modified.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a sensor device including a sensor chip having a sensing portion on a surface thereof, the sensing portion being configured to be displaced when mechanical quantity is applied to the sensing portion to detect the mechanical quantity based on the displacement, comprising:
   mounting the sensor chip on a first surface of a substrate;
   arranging a resin having at least one of a volatile property and a foamable property on the sensor chip, thereby covering the sensor chip;
   sealing the sensor chip covered by the resin and the substrate by a sealing member on the first surface of the substrate, such that a surface of the sensor chip on an opposite side from the first surface of the substrate is exposed, after the covering of the sensor chip; and
   curing the sealing member, and heating the resin to be vaporized or foamed after the sealing of the sensor chip and the substrate so that a void is formed between a covered portion in the sensor chip, which is covered by the sealing member, and the sealing member, wherein
   in the sealing by the sealing member, a part of the sensor chip is used as an unsealed portion that is not sealed by the sealing member, and the sensor chip and the substrate are sealed such that the resin communicates with an outside via the unsealed portion,
   after the sealing, the void is formed by discharge of the vaporized or foamed resin from the unsealed portion when the resin is heated,
   the unsealed portion serves as the sensing portion of the sensor chip, and
   in the arranging of the resin, the resin is arranged on the sensor chip such that the sensing portion is exposed to the outside from the resin.

2. The method according to claim 1, further comprising:
   arranging the resin at a position of the first surface of the substrate, on which the sensor chip is to be mounted, before the mounting of the sensor chip, wherein
   after the resin is arranged, the sensor chip is mounted on the resin, and
   an area of the covered portion in the surface of the sensor chip is sealed by the sealing member without being covered by the resin so that the sensor chip is fixed to the first surface of the substrate by an adhesive force of the sealing member that adheres to the surface of the sensor chip, which is not covered by the resin.

3. The method according to claim 1, further comprising:
   forming a through-hole at a position of the first surface of the substrate, on which the sensor chip is to be mounted, wherein
   the through-hole has an aperture size smaller than a size of the sensor chip and penetrates the substrate from the first surface to a second surface opposite to the first surface,
   the sensor chip is mounted such that the through-hole is covered by the sensor chip and the unsealed portion faces toward the outside through the through-hole, and
   the resin is arranged such that the resin communicates with the outside through the through-hole from a side of the first surface of the substrate.

4. A method for manufacturing a sensor device including a sensor chip with a sensing portion on a surface thereof, the sensing portion being configured to be displaced when a mechanical quantity is applied to the sensing portion, a magnitude of the mechanical quantity being determined based on a magnitude of the displacement, the method comprising:
   mounting the sensor chip on a first surface of a substrate;
   covering sides of the sensor chip with a resin characterized by at least one of a volatile property and a foamable property;
   sealing the sensor chip, with the sides covered by the resin and mounted on the first surface of the substrate, by a sealing member sealed to the first surface of the substrate, wherein
      an upper surface of the sensor chip, on an opposite side from the first surface of the substrate, and including the sensing portion, is exposed to the outside through an opening in the sealing member, and
      the resin on the side walls of the sensor chip is also exposed to the outside through the opening in the sealing member;
   curing the sealing member and heating the resin such that the resin is vaporized or foamed and discharged through the opening, including the sensing portion, thereby forming a void between at least a portion of the sides of the sensor chip and the sealing member.

5. The method for manufacturing a sensor device according to claim 4, further comprising:
   prior to mounting the sensor chip on the first surface of the substrate, forming electrodes on the bottom of the sensor chip such that the sensor chip is mounted to the first surface of the substrate through the electrodes, by the application of pressure and heat.

6. The method for manufacturing a sensor device according to claim 5, wherein
   when covering the sides of the sensor chip with resin, some resin enters into a space between a lower surface of the sensor chip and the first surface of the substrate.

7. The method for manufacturing a sensor device according to claim 5, wherein
   curing the sealing member and heating the resin such that the resin is vaporized or foamed and discharged through the opening further includes forming a void between at least a portion of a lower surface of the sensor chip and the first surface of the substrate.

* * * * *